United States Patent

Masaoka

(10) Patent No.: US 9,496,866 B2
(45) Date of Patent: Nov. 15, 2016

(54) VOLTAGE CONTROLLER THAT CONTROLS A RATE OF CHANGE OF AN OUTPUT VOLTAGE

(71) Applicant: Mitsubishi Electric Corporation, Chiyoda-ku, Tokyo (JP)

(72) Inventor: Tetsuya Masaoka, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 14/664,309

(22) Filed: Mar. 20, 2015

(65) Prior Publication Data

US 2016/0072501 A1    Mar. 10, 2016

(30) Foreign Application Priority Data

Sep. 10, 2014 (JP) ................. 2014-183876

(51) Int. Cl.
*H03K 17/687* (2006.01)
*H03K 17/16* (2006.01)

(52) U.S. Cl.
CPC .......... *H03K 17/687* (2013.01); *H03K 17/167* (2013.01)

(58) Field of Classification Search
CPC ...... H03K 5/133; H03K 5/135; H03K 17/61; H03K 17/223; H03K 17/691; H03K 17/687; H03K 17/567; H03K 17/063; H03K 17/0822

USPC ................. 327/108, 109, 110, 111, 112, 374
See application file for complete search history.

(56) References Cited

U.S. PATENT DOCUMENTS

| 6,124,747 A | 9/2000 | Nasu |
| 6,586,973 B2 | 7/2003 | Yokoyama et al. |
| 8,754,689 B2 | 6/2014 | Suzuki et al. |
| 2002/0075049 A1 | 6/2002 | Yokoyama et al. |
| 2008/0265975 A1* | 10/2008 | Takasu .............. H03K 17/08142 327/374 |
| 2013/0009671 A1 | 1/2013 | Suzuki et al. |

FOREIGN PATENT DOCUMENTS

| JP | 11-308087 A | 11/1999 |
| JP | 2000-332593 A | 11/2000 |
| JP | 2008-263349 A | 10/2008 |
| JP | 2012-175115 A | 9/2012 |
| JP | 2013-017078 A | 1/2013 |
| JP | 5385341 B2 | 1/2014 |

* cited by examiner

*Primary Examiner* — John Poos
(74) *Attorney, Agent, or Firm* — Buchanan Ingersoll & Rooney PC

(57) ABSTRACT

A rising time detecting circuit detects a rising time of an output voltage, and generates a rising time voltage according to the rising time. A rising time comparing circuit compares the rising time voltage with a target rising voltage, and outputs a rising comparison signal showing a compared result. A FET driving circuit controls an upper MOSFET based on the rising comparison signal. A rising regulating circuit regulates a change speed of the rising time voltage according to a rising regulating signal.

7 Claims, 11 Drawing Sheets

VOLTAGE CONTROLLER THAT CONTROLS A RATE OF CHANGE OF AN OUTPUT VOLTAGE

CROSS-REFERENCE TO RELATED APPLICATIONS

This application is based on and claims the benefit of priority from Japanese Patent Application No. 2014-183876, filed in Japan on Sep. 10, 2014, the content of which is incorporated herein by reference in its entirety.

TECHNICAL FIELD

The present invention relates to a technique to control a voltage control element.

BACKGROUND ART

In accordance with the improvement of the responsiveness of a power element (for instance, MOSFET) mounted on a motor driver or a power circuit and the like, a steep change of voltage or electric current tends to occur in the switching operation to drive the power element. The power element is a voltage control element for controlling the electric power and the voltage. MOSFET is an abbreviation for metal-oxide-semiconductor field-effect transistor.

The steep change of voltage or electric current causes generation of noise, which might cause malfunction of other components or the product. Therefore, it is required to control the voltage and the electric current so as to change moderately.

Patent Literature 1 and Patent Literature 2 propose noise suppression method.

The method of Patent Literature 1 is that electric potential information of an output terminal is compared with a reference value, and based on the compared result, a switching operation of a transistor is controlled according to a control signal output from a delay circuit after the predetermined time has passed. By this operation, after the predetermined time has passed, a slew rate of output waveform can be maintained within a certain range.

In this method, if the predetermined time (for instance, 1 micro second) is longer than a target time (for instance, 100 nanoseconds) of the slew rate of output waveform, after the predetermined time has passed, the output waveform has already risen. Therefore, the method of Patent Literature 1 cannot regulate the slew rate of output waveform.

The method of Patent Literature 2 is that a phase difference between the slew rate of a delay signal of an output signal that is delayed with a predetermined time and the slew rate of the output signal is detected, and an electric current driving force of an output buffer is regulated according to the detected signal.

Patent Literature 2 describes that the slew rate of the output signal can be regulated by regulating the delay circuit. However, a specific method to regulate the delay circuit (for instance, a calculation method of regulation quantity) is not disclosed. Accordingly, the slew rate of the output signal cannot be regulated to a target slew rate using the method of Patent Literature 2.

CITATION LIST

Patent Literature

Patent Literature 1: JP 11-308087A
Patent Literature 2: JP 2008-263349A

SUMMARY OF INVENTION

Technical Problem

An object of the present invention is to enable to regulate, for instance, a rising time of an output voltage.

Solution to Problem

According to the present invention, a voltage controller includes:
a voltage control element that controls a speed to change an output voltage;
a rising time detecting circuit that detects a rising time of the output voltage controlled by the voltage control element required for rising from a first reference voltage to a second reference voltage, and generates a rising time voltage according to a length of the rising time;
a rising time comparing circuit that compares the rising time voltage generated by the rising time detecting circuit with a target rising voltage showing a target rising time which is a target of the rising time, and outputs a rising comparison signal showing a compared result; and
an element control circuit that controls the voltage control element based on the rising comparison signal output by the rising time comparing circuit.

Advantageous Effects of Invention

The present invention enables to regulate, for instance, the rising time of the output voltage.

BRIEF DESCRIPTION OF DRAWINGS

The present invention will become fully understood from the detailed description given hereinafter in conjunction with the accompanying drawings, in which.

DESCRIPTION OF EMBODIMENTS

Figure 1:
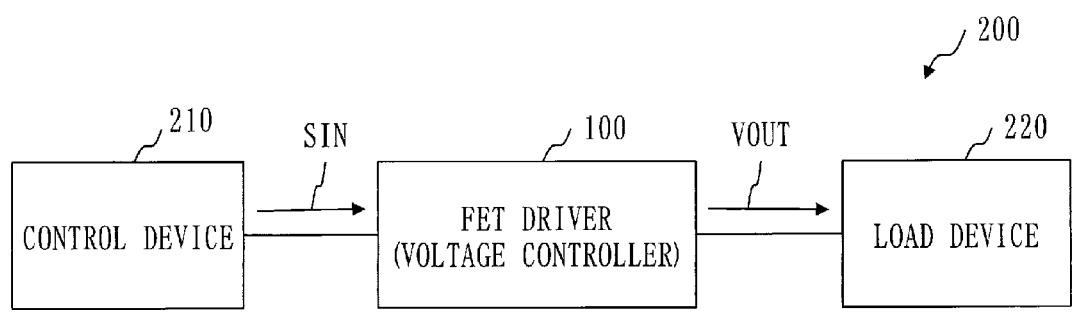
FIG. 1 is a configuration diagram of an electronic device 200 according to a first embodiment.

In describing a preferred embodiment illustrated in the drawings, specific terminology is employed for the sake of clarity. However, the disclosure of the present invention is not intended to be limited to the specific terminology so selected, and it is to be understood that each specific element includes all technical equivalents that operate in a similar manner and achieve a similar result.

Embodiment 1

An embodiment to regulate a rising time and a falling time of an output voltage will be explained.

FIG. 1 is a configuration diagram of an electronic device 200 according to a first embodiment.

The configuration of the electronic device 200 according to the first embodiment will be explained with reference to FIG. 1. However, the configuration of the electronic device 200 may not be necessarily the same as the configuration of FIG. 1.

The electronic device 200 is provided with a control device 210 and an FET driver 100 (an example of a voltage controller), and a load device 220.

The control device 210 inputs a control signal SIN and other signals to the FET driver 100, and thereby controls the FET driver 100. For instance, the control device 210 is a micro-computer.

The FET driver 100 drives MOSFET (109S and 109E of FIG. 2) according to signals received from the control device 210, and thereby outputs an output voltage VOUT to the load device 220. MOSFET is an abbreviation for metal-oxide-semiconductor field-effect transistor. For instance, the FET driver 100 functions as a motor driver operating a motor or a power circuit supplying electric power. Details of the FET driver 100 will be discussed later.

The load device 220 operates by using an output voltage VOUT output from the FET driver 100 as electric power. For instance, the load device 220 is a motor.

Figure 2:
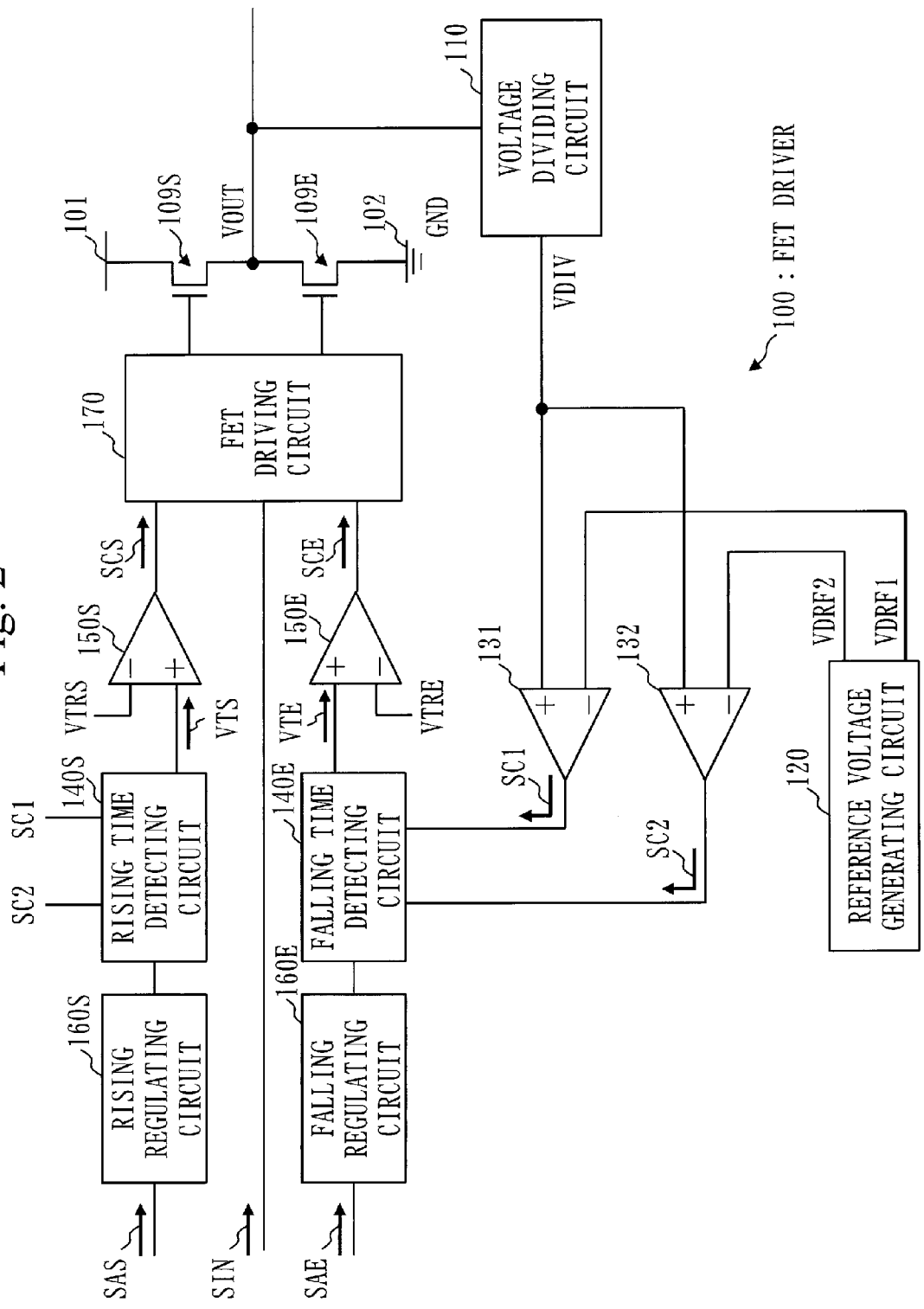
FIG. 2 is a configuration diagram of an FET driver 100 according to the first embodiment.

FIG. 2 is a configuration diagram of the FET driver 100 according to the first embodiment.

The configuration of the FET driver 100 according to the first embodiment will be explained with reference to FIG. 2. However, the configuration of the FET driver 100 may not be necessarily the same as FIG. 2.

The FET driver 100 drives an upper MOSFET 109S (an example of a first voltage control element) and a lower MOSFET 109E (an example of a second voltage control element) according to signals received from the control device 210 (for instance, a control signal SIN), and thereby outputs the output voltage VOUT to the load device 220.

The control signal SIN is a signal to control the output of the output voltage VOUT.

Figure 3:
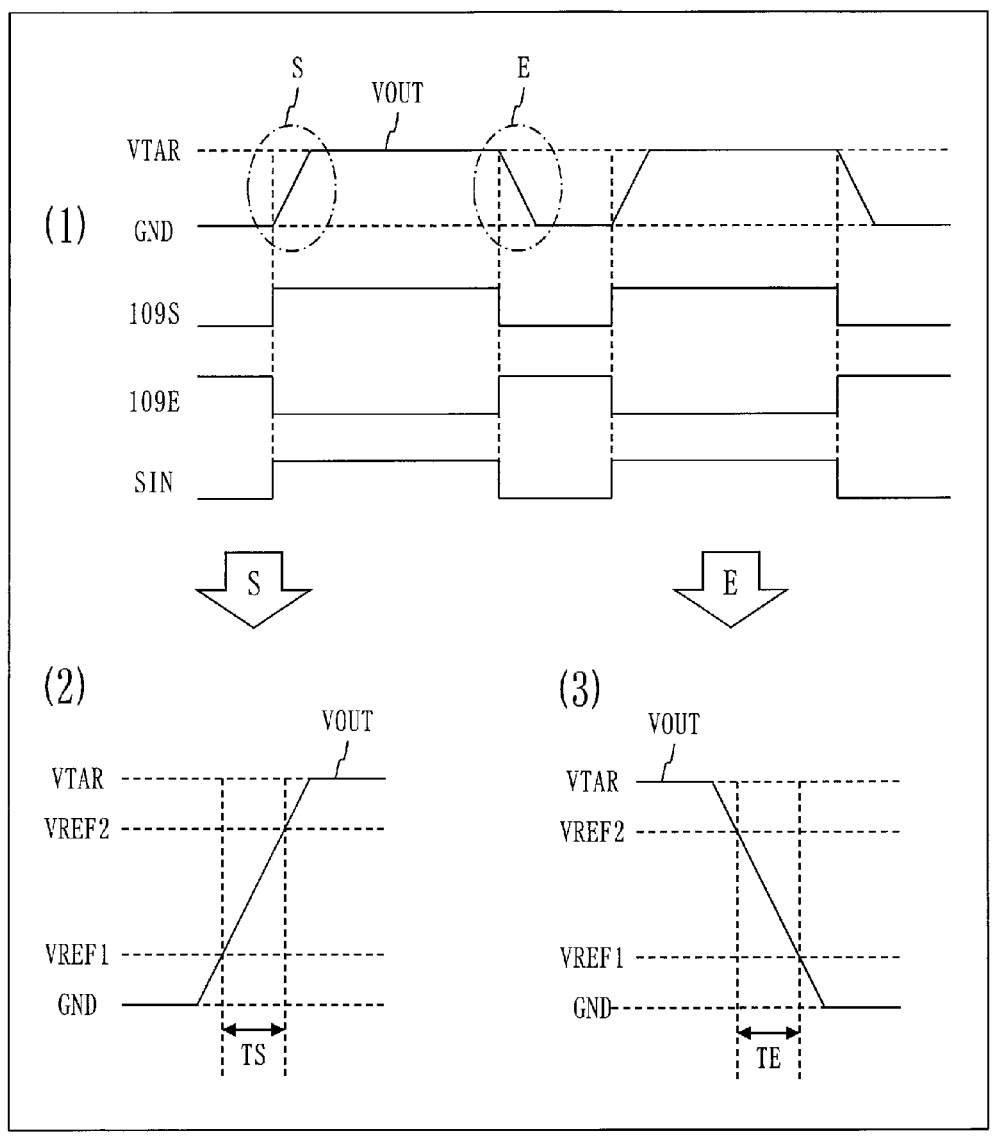
FIG. 3 is a diagram showing a waveform of an output voltage VOUT according to the first embodiment.

FIG. 3 is a diagram showing a waveform of the output voltage VOUT according to the first embodiment.

(1) of FIG. 3 is a diagram showing relationship between the output voltage VOUT and the control signal SIN; and (2) of FIG. 3 is an enlarged view of a part included by an alternate long and short dash line S of (1). (3) of FIG. 3 is an enlarged view of a part included by an alternate long and short dash line E of (1).

In (1) of FIG. 3, in a case where the voltage of the control signal SIN is high level, the control signal SIN means to output the output voltage VOUT.

In a case where the voltage of the control signal SIN is low level, the control signal SIN means to stop outputting the output voltage VOUT.

In (1) of FIG. 3, after the voltage of the control signal SIN switches from Low level to High level, the output voltage VOUT rises from a ground voltage GND to a target output voltage VTAR.

Further, after the voltage of the control signal SIN switches from High level to Low level, the output voltage VOUT falls from the target output voltage VTAR to the ground voltage GND.

In (2) of FIG. 3, a time required for rising of the output voltage VOUT from a first output reference voltage VREF1 to a second output reference voltage VREF2 is referred to as a rising time TS.

In (3) of FIG. 3, a time required for falling of the output voltage VOUT from the second output reference voltage VREF2 to the first output reference voltage VREF1 is referred to as a falling time TE.

Returning to FIG. 2, the explanation of the configuration of the FET driver 100 will be continued.

The FET driver 100 regulates the rising time TS of the output voltage VOUT, and thereby regulates a slew rate of the output voltage VOUT at the time of rising. The slew rate is a speed to change the output voltage VOUT.

Further, the FET driver 100 regulates the falling time TE of the output voltage VOUT, and thereby regulates the slew rate of the output voltage VOUT at the time of falling.

The upper MOSFET 109S and the lower MOSFET 109E are connected in series between a voltage source 101 and a ground 102.

The upper MOSFET 109S is a MOSFET to be connected to the voltage source 101; and the lower MOSFET 109E is a MOSFET to be connected to the ground 102.

The output voltage VOUT is a voltage between the upper MOSFET 109S and the lower MOSFET 109E.

The FET driver 100 is provided with a voltage dividing circuit 110, a reference voltage generating circuit 120, a first comparing circuit 131, a second comparing circuit 132, and a FET driving circuit 170 (an example of an element control circuit).

Further, the FET driver 100 is provided with a rising time detecting circuit 140S, a rising time comparing circuit 150S, and a rising regulating circuit 160S.

In addition, the FET driver 100 is provided with a falling time detecting circuit 140E, a falling time comparing circuit 150E, and a falling regulating circuit 160E.

The voltage dividing circuit 110 divides the output voltage VOUT, and thereby outputs the voltage within a range that is allowed to input to the first comparing circuit 131 and the second comparing circuit 132.

A voltage output from the voltage dividing circuit 110 is referred to as a divided voltage VDIV. The divided voltage VDIV is proportional to the magnitude of the output voltage VOUT.

The reference voltage generating circuit 120 generates a first reference divided voltage VDRF1 and a second reference divided voltage VDRF2.

The first reference divided voltage VDRF1 corresponds to a divided voltage of the first output reference voltage VREF1 (refer to (2) of FIG. 3), and the second reference divided voltage VDRF2 corresponds to a divided voltage of the second output reference voltage VREF2 (refer to (3) of FIG. 3).

A first comparing circuit 131 compares the divided voltage VDIV with the first reference divided voltage VDRF1, and outputs a first comparison signal SC1 based on the compared result.

The first comparison signal SC1 is a signal showing whether or not the divided voltage VDIV is larger than the first reference divided voltage VDRF1.

For instance, if the divided voltage VDIV is smaller than the first reference divided voltage VDRF1, the first comparison signal SC1 has the voltage of Low level.

Further, if the divided voltage VDIV is larger than the first reference divided voltage VDRF1, the first comparison signal SC1 has the voltage of High level.

The second comparing circuit 132 compares the divided voltage VDIV with the second reference divided voltage VDRF2 and outputs a second comparison signal SC2 based on the compared result.

The second comparison signal SC2 is a signal showing whether or not the divided voltage VDIV is larger than the second reference divided voltage VDRF2.

For instance, if the divided voltage VDIV is smaller than the second reference divided voltage VDRF2, the second comparison signal SC2 has the voltage of Low level.

Further, if the divided voltage VDIV is larger than the second reference divided voltage VDRF2, the second comparison signal SC2 has the voltage of High level.

The rising time detecting circuit 140S outputs a rising time voltage VTS based on the first comparison signal SC1 and the second comparison signal SC2.

The rising time voltage VTS is a voltage showing the rising time TS. For instance, the magnitude of the rising time voltage VTS is proportional to the length of the rising time TS.

The rising time comparing circuit 150S compares the rising time voltage VTS with a target rising voltage VTRS and outputs a rising comparison signal SCS based on the compared result.

The target rising voltage VTRS is a voltage showing a target time of rising. Hereinafter, the target time of rising is referred to as a target rising time TTRS.

The rising comparison signal SCS is a signal showing whether or not the rising time TS is longer than the target rising time TTRS.

For instance, if the rising time voltage VTS is larger than the target rising voltage VTRS, the rising comparison signal SCS has the voltage of High level. In this case, the rising time TS is longer than the target rising time TTRS.

Further, if the rising time voltage VTS is smaller than the target rising voltage VTRS, the rising comparison signal SCS has the voltage of Low level. In this case, the rising time TS is shorter than the target rising time TTRS.

The rising regulating circuit 160S regulates a change speed of the rising time voltage VTS based on a rising regulating signal SAS received from the control device 210. The change speed is the size of the change of the rising time voltage VTS per unit time.

The falling time detecting circuit 140E outputs a falling time voltage VTE based on the first comparison signal SC1 and the second comparison signal SC2.

The falling time voltage VTE is a voltage showing the falling time TE. For instance, the magnitude of the falling time voltage VTE is proportional to the length of the falling time TE.

The falling time comparing circuit 150E compares the falling time voltage VTE with a target falling voltage VTRE and outputs a falling comparison signal SCE based on the compared result.

The target falling voltage VTRE is a voltage showing a target time of falling. Hereinafter, the target time of falling is referred to as a target falling time TTRE.

The falling comparison signal SCE is a signal showing whether or not the falling time TE is longer than the target falling time TTRE.

For instance, if the falling time voltage VTE is larger than the target falling voltage VTRE, the falling comparison signal SCE has a voltage of High level. In this case, the falling time TE is longer than the target falling time TTRE.

Further, if the falling time voltage VTE is smaller than the target falling voltage VTRE, the falling comparison signal SCE has a voltage of Low level. In this case, the falling time TE is shorter than the target falling time TTRE.

The falling regulating circuit 160E regulates a change speed of the falling time voltage VTE based on a falling regulating signal SAE received from the control device 210. The change speed is a size of the change of the falling time voltage VTE per unit time.

The FET driving circuit 170 drives the upper MOSFET 109S based on the control signal SIN and the rising comparison signal SCS.

Further, the FET driving circuit 170 drives the lower MOSFET 109E based on the control signal SIN and the falling comparison signal SCE.

In (1) of FIG. 3, in a case where the voltage of the control signal SIN is switched from Low level to High level, the FET driving circuit 170 switches the upper MOSFET 109S ON from OFF, and switches the lower MOSFET 109E OFF from ON.

Then, the output voltage VOUT rises from the ground voltage GND to the target output voltage VTAR, and the rising time comparing circuit 150S outputs the rising comparison signal SCS.

Then, the FET driving circuit 170 regulates a rising speed of a gate voltage of the upper MOSFET 109S based on the rising comparison signal SCS, and thereby regulates the rising time TS. The gate voltage is a voltage to be applied to a gate terminal of the MOSFET. The rising speed is a speed with which the gate voltage rises.

In a case where the rising comparison signal SCS shows the rising time TS is longer than the target rising time TTRS, the FET driving circuit 170 increases the rising speed of the gate voltage of the upper MOSFET 109S. By this operation, the next rising time TS is shortened.

In a case where the rising comparison signal SCS shows the rising time TS is shorter than the target rising time TTRS, the FET driving circuit 170 decreases the rising speed of the gate voltage of the upper MOSFET 109S. By this operation, the next rising time TS is extended.

The rising speed after regulation is used for starting outputting the output voltage VOUT next time.

That is, the FET driving circuit 170 increases the gate voltage of the upper MOSFET 109S with the rising speed after regulation, at the time of starting outputting the output voltage VOUT next time.

In (1) of FIG. 3, in a case where the voltage of the control signal SIN is switched from High level to Low level, the FET driving circuit 170 switches the upper MOSFET 109S OFF from ON and switches the lower MOSFET 109E ON from OFF.

Then, the output voltage VOUT falls from the target output voltage VTAR to the ground voltage GND, and the falling time comparing circuit 150E outputs the falling comparison signal SCE.

Then, the FET driving circuit 170 regulates the falling speed of the gate voltage of the lower MOSFET 109E based on the falling comparison signal SCE, and thereby regulates the falling time TE. The falling speed is a speed with which the gate voltage falls.

In a case where the falling comparison signal SCE shows the falling time TE is longer than the target falling time TTRE, the FET driving circuit 170 increases the falling speed of the gate voltage of the lower MOSFET 109E. By this operation, the next falling time TE is shortened.

In a case where the falling comparison signal SCE shows the falling time TE is shorter than the target falling time TTRE, the FET driving circuit 170 decreases the falling speed of the gate voltage of the lower MOSFET 109E. By this operation, the next falling time TE is extended.

The falling speed after regulation is used for stopping outputting the output voltage VOUT next time.

That is, the FET driving circuit 170 decreases the gate voltage of the lower MOSFET 109E with the falling speed after regulation, at the time of stopping outputting the output voltage VOUT next time.

The rising speed of the gate voltage of the upper MOSFET 109S can be regulated like the following. The falling speed of the gate voltage of the lower MOSFET 109E can be also regulated in the same manner.

For instance, the FET driving circuit 170 is provided with a resistance circuit to be connected to the upper MOSFET 109S. Then, after regulating the resistance value of the resistance circuit, the FET driving circuit 170 flows the constant current to the resistance circuit and the upper MOSFET 109S. By this operation, the rising speed of the gate voltage of the upper MOSFET 109S can be regulated. The resistance circuit is provided with a plurality of resistances to be connected to the upper MOSFET 109S via a plurality of switches; the resistance value of the resistance circuit is changed by controlling the plurality of switches.

For instance, the FET driving circuit 170 is provided with a current circuit which changes the magnitude of the electric current flowing through the upper MOSFET 109S. Then, the FET driving circuit 170 controls the current circuit, and thereby regulates the magnitude of the electric current flowing through the upper MOSFET 109S. By this operation, the rising speed of the gate voltage of the upper MOSFET 109S can be regulated.

Figure 4:
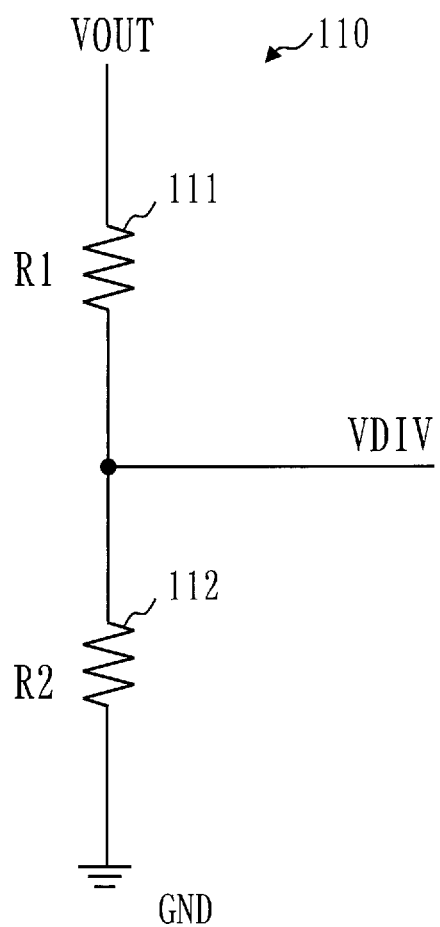
FIG. 4 is a diagram showing an example of a voltage dividing circuit 110 according to the first embodiment.

FIG. 4 is a diagram showing an example of the voltage dividing circuit 110 according to the first embodiment.

An example of the voltage dividing circuit 110 according to the first embodiment will be explained with reference to FIG. 4.

The voltage dividing circuit 110 divides the output voltage VOUT to output a divided voltage VDIV.

The voltage dividing circuit 110 is provided with a first voltage dividing resistance 111 and a second voltage dividing resistance 112 which are connected in series.

The first voltage dividing resistance 111 is a resistance of the high voltage side (VOUT), and the second voltage dividing resistance 112 is a resistance of the low voltage side (GND). The divided voltage VDIV is a voltage between the first voltage dividing resistance 111 and the second voltage dividing resistance 112.

The divided voltage VDIV can be expressed by the following expression (1). In the expression (1), R1 denotes a resistance value of the first voltage dividing resistance 111, and R2 denotes a resistance value of the second voltage dividing resistance 112.

$$VIDV = VOUT \times (R2/(R1+R2))$$ expression (1)

Figure 5:
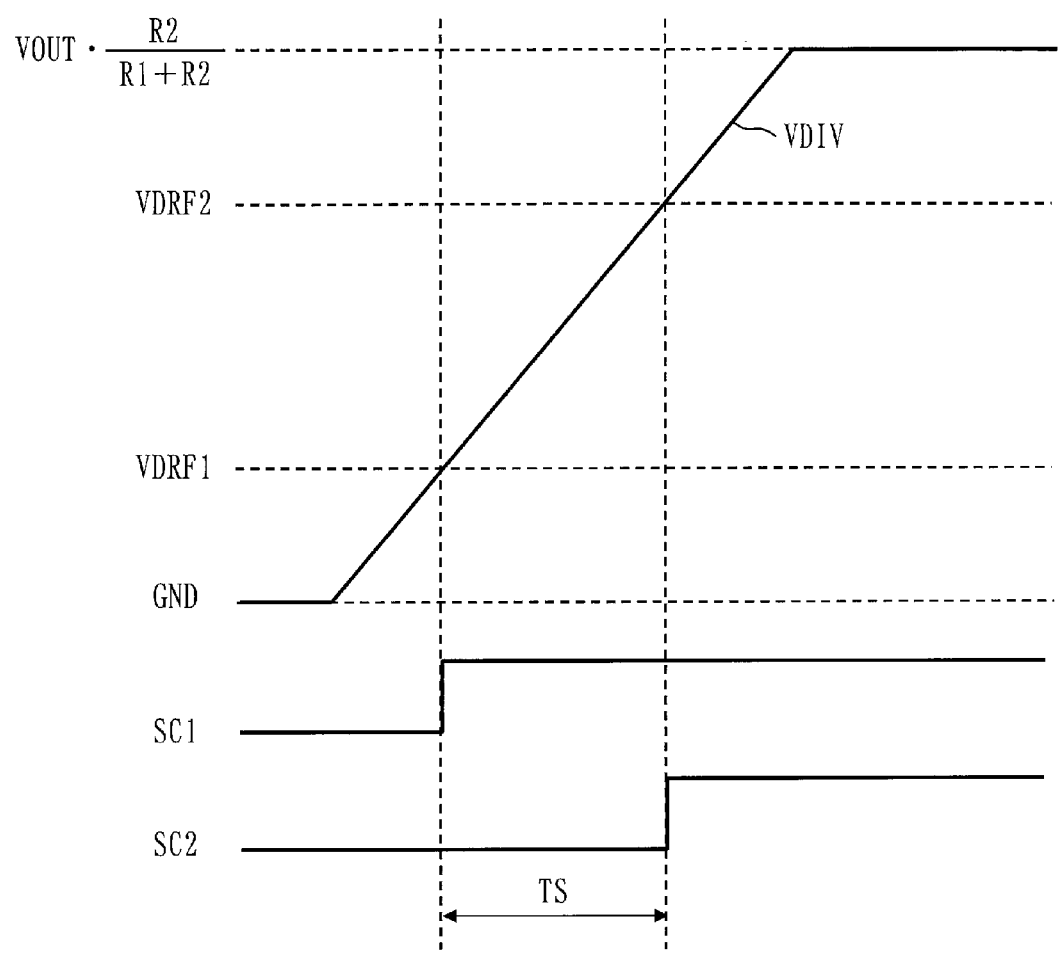
FIG. 5 is a diagram showing relationship between a divided voltage VDIV and a comparison signal (SC1, SC2) according to the first embodiment.

FIG. 5 is a diagram showing relationship between the divided voltage VDIV and the comparison signals (SC1, SC2) according to the first embodiment.

The operation of the first comparing circuit 131 and the second comparing circuit 132 will be explained with reference to FIG. 5.

The first comparing circuit 131 compares the divided voltage VDIV with the first reference divided voltage VDRF1, and outputs the first comparison signal SC1 based on the compared result.

If the divided voltage VDIV is smaller than the first reference divided voltage VDRF1, the first comparison signal SC1 has the voltage of Low level.

If the divided voltage VDIV is larger than the first reference divided voltage VDRF1, the first comparison signal SC1 has the voltage of High level.

The second comparing circuit 132 compares the divided voltage VDIV with the second reference divided voltage VDRF2, and outputs the second comparison signal SC2 based on the compared result.

If the divided voltage VDIV is smaller than the second reference divided voltage VDRF2, the second comparison signal SC2 has the voltage of Low level.

If the divided voltage VDIV is larger than the second reference divided voltage VDRF2, the second comparison signal SC2 has the voltage of High level.

However, as for the first comparison signal SC1 and the second comparison signal SC2, the voltage of Low level can be replaced with the voltage of High level, and the voltage of High level can be replaced with the voltage of Low level.

The rising time TS corresponds to a time during which any one of the first comparison signal SC1 and the second comparison signal SC2 has the voltage of High level.

FIG. 5 shows the output voltage VOUT and the divided voltage VDIV at the time of rising; however, the same can be applied to the output voltage VOUT and the divided voltage VDIV at the time of falling.

Figure 6:
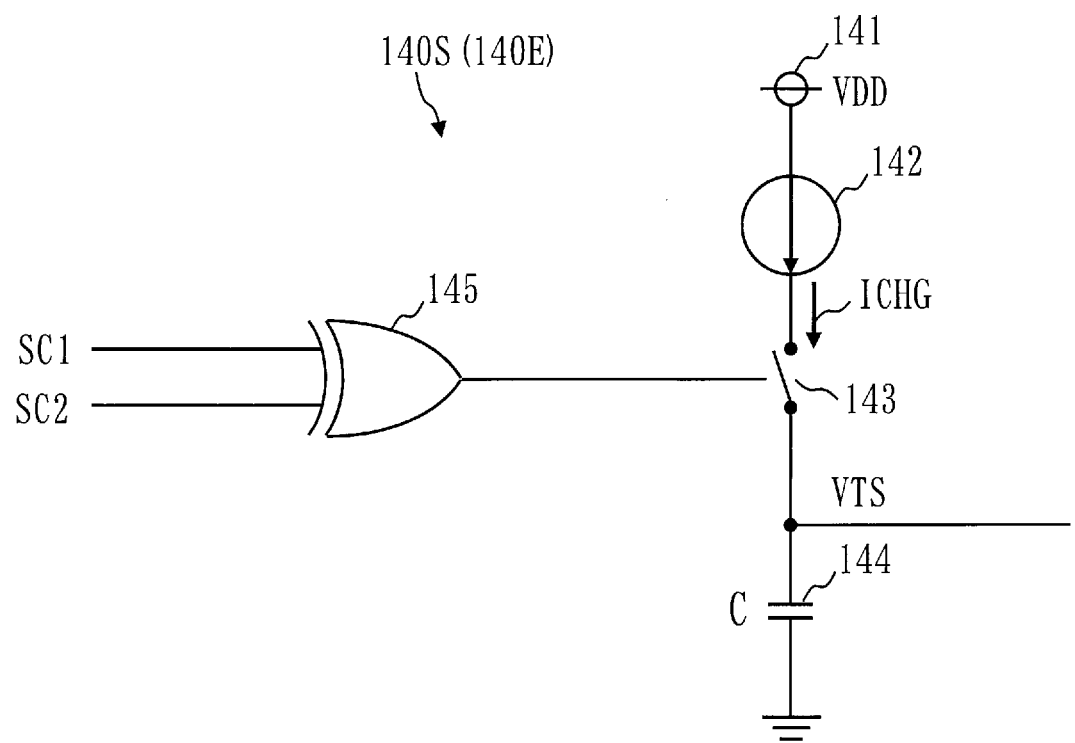
FIG. 6 is a diagram showing a configuration example of a rising time detecting circuit 140S according to the first embodiment.

FIG. 6 is a diagram showing a configuration example of the rising time detecting circuit 140S according to the first embodiment.

A configuration example of the rising time detecting circuit 140S according to the first embodiment will be explained with reference to FIG. 6.

The rising time detecting circuit 140S outputs the rising time voltage VTS based on the first comparison signal SC1 and the second comparison signal SC2.

The rising time detecting circuit 140S is provided with a voltage source 141, a current source 142, a charging switch 143, a capacitor 144, and an XOR circuit 145.

The voltage source 141 generates a control voltage VDD.

The current source 142 generates a charging current ICHG to charge the capacitor 144.

The capacitor 144 is connected to the current source 142 via the charging switch 143.

The rising time voltage VTS is a voltage generated at the capacitor 144.

The XOR circuit 145 detects the rising time TS based on the first comparison signal SC1 and the second comparison signal SC2, and controls the charging switch 143. XOR is an abbreviation for an exclusive disjunction.

In a case where any one of the first comparison signal SC1 and the second comparison signal SC2 has the voltage of High level (or Low level), the XOR circuit 145 turns the charging switch 143 ON. That is, the XOR circuit 145 maintains the charging switch 143 ON during the rising time TS.

In a case where both the first comparison signal SC1 and the second comparison signal SC2 have the voltage of High level, and a case where both the first comparison signal SC1 and the second comparison signal SC2 have the voltage of Low level, the XOR circuit 145 turns the charging switch 143 OFF. That is, the XOR circuit 145 maintains, except for the rising time TS, the charging switch 143 OFF.

By the operation of the XOR circuit 145, the charging current ICHG flows to the capacitor 144 during the rising time TS to charge the capacitor 144. Then, the rising time voltage VTS having the magnitude corresponding to the length of the rising time TS is generated.

The rising time voltage VTS can be expressed by the following expression (2). In the expression (2), C denotes a capacity of the capacitor 144.

$$VTS=(ICHG \times TS)/C \qquad \text{expression (2)}$$

The target rising voltage VTRS can be expressed by the following expression (3) using the target rising time TTRS.

$$VTRS=(ICHG \times TTRS)/C \qquad \text{expression (3)}$$

As shown in the expression (2), the rising time voltage VTS is proportional to the magnitude of the charging current ICHG and the length of the rising time TS, and is inversely proportional to the size of the capacity C.

As shown in the expression (3), the target rising voltage VTRS is proportional to the magnitude of the charging current ICHG and the length of the target rising time TTRS, and is inversely proportional to the size of the capacity C.

FIG. 6 illustrates the configuration of the rising time detecting circuit 140S; and the configuration of the falling time detecting circuit 140E is also the same as the configuration illustrated in FIG. 6.

Figure 7:
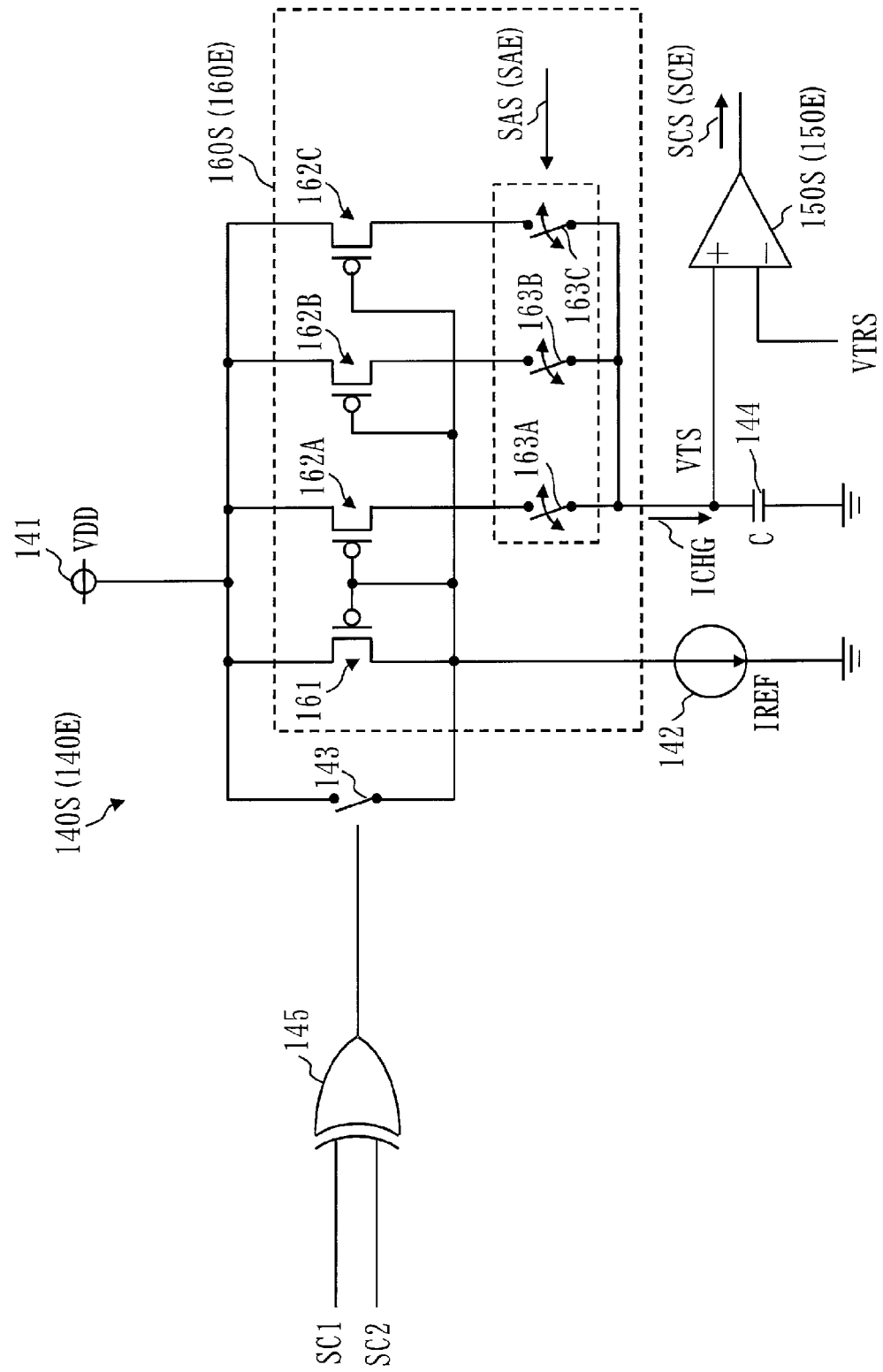
FIG. 7 is a diagram showing a first configuration example of the rising time detecting circuit 140S, a rising time comparing circuit 150S, and a rising regulating circuit 160S according to the first embodiment.

FIG. 7 is a diagram showing a first configuration example of the rising time detecting circuit 140S, the rising time comparing circuit 150S, and the rising regulating circuit 160S according to the first embodiment.

The first configuration example of the rising time detecting circuit 140S, the rising time comparing circuit 150S, and the rising regulating circuit 160S according to the first embodiment will be explained with reference to FIG. 7.

The configuration of the rising time detecting circuit 140S is the same as FIG. 6. However, the current generated by the current source 142 is the reference current IREF.

The rising regulating circuit 160S regulates the magnitude of the charging current ICHG according to the rising regulating signal SAS received from the control device 210. The magnitude of the charging current ICHG is regulated, and thereby the change speed of the rising time voltage VTS can be regulated.

The rising regulating circuit 160S can be configured as a current mirror circuit which changes the magnitude of the charging current ICHG.

The rising regulating circuit 160S is provided with a first transistor 161, a plurality of second transistors (162A to 162C) which are connected in parallel to the first transistor 161, and a plurality of regulation switches (163A to 163C) which are connected in series to the plurality of second transistors.

Through the first transistor 161, the reference current IREF flows.

Through the second transistor 162 connected to the regulation switch 163 with ON status, the electric current having the magnitude according to the reference current IREF flows. For instance, the electric current having the same magnitude as the reference current IREF flows.

The magnitude of the charging current ICHG is a sum of the electric current which flows through the second transistor 162 connected to the regulation switch 163 with ON status.

For instance, n regulation switches 163 are turned ON, and thereby obtains the charging current ICHG having the magnitude of n times of IREF.

The control device 210 selects a magnitude of the charging current ICHG out of a plurality of electric current quantities (large, middle, small) based on the length of the target rising time TTRS, and generates the rising regulating signal SAS based on the magnitude of the charging current ICHG.

For instance, the control device 210 generates the rising regulating signal SAS like the following. Note that a first threshold time value shows a time being longer than a second threshold time value.

If the target rising time TTRS is longer than the first threshold time value, the control device 210 selects an electric current quantity (small) for the magnitude of the charging current ICHG.

In a case where the electric current quantity (small) is selected, the control device 210 generates the rising regulating signal SAS which turns the regulation switch 163A ON and turns the regulation switch 163B and the regulation switch 163C OFF.

If the target rising time TTRS is shorter than the first threshold time value and longer than the second threshold time value, the control device 210 selects an electric current quantity (middle) for the magnitude of the charging current ICHG.

In a case where the electric current quantity (middle) is selected, the control device 210 generates the rising regulating signal SAS which turns the regulation switch 163A and the regulation switch 163B ON and turns the regulation switch 163C OFF.

If the target rising time TTRS is shorter than the second threshold time value, the control device 210 selects an electric current quantity (large) for the magnitude of the charging current ICHG.

In a case where the electric current quantity (large) is selected, the control device 210 generates the rising regulating signal SAS which turns all the regulation switches (163A to 163C) ON.

If the target rising time TTRS is long, the rising time TS becomes long in accordance with the target rising time TTRS, and the rising time voltage VTS becomes large.

In this case, the rising time voltage VTS exceeds a range of allowable voltage (a voltage which is allowed to be input) of the rising time comparing circuit 150S, which might cause the rising time comparing circuit 150S not to operate properly. As a result, the rising time comparing circuit 150S cannot output the correct rising comparison signal SCS.

Then, the control device 210 generates the rising regulating signal SAS which controls the plurality of regulation switches (163A to 163C) so as to decrease the charging current ICHG. By this operation, the rising time voltage VTS has become a voltage within the range of allowable voltage of the rising time comparing circuit 150S.

If the target rising time TTRS is short, the rising time TS becomes short in accordance with the target rising time TTRS, and the rising time voltage VTS becomes small.

In this case, the rising time voltage VTS is not sufficiently large compared with the offset voltage of the rising time comparing circuit 150S, which might cause the rising time comparing circuit 150S not to compare the rising time voltage VTS with the target rising voltage VTRS properly.

As a result, the rising time comparing circuit 150S cannot output the correct rising comparison signal SCS.

Then, the control device 210 generates the rising regulating signal SAS which controls the plurality of regulation switches (163A to 163C) so as to increase the charging current ICHG. By this operation, the rising time voltage VTS has become a sufficiently large voltage compared with the offset voltage of the rising time comparing circuit 150S.

Further, the control device 210 calculates the above expression (3), and thereby calculates the magnitude of the target rising voltage VTRS. Then, the control device 210 outputs the target rising voltage VTRS to the rising time comparing circuit 150S.

FIG. 7 illustrates the configuration of the rising time detecting circuit 140S, the rising time comparing circuit 150S, and the rising regulating circuit 160S; and the configuration of the falling time detecting circuit 140E, the falling time comparing circuit 150E, and the falling regulating circuit 160E are also the same as FIG. 7.

Figure 8:
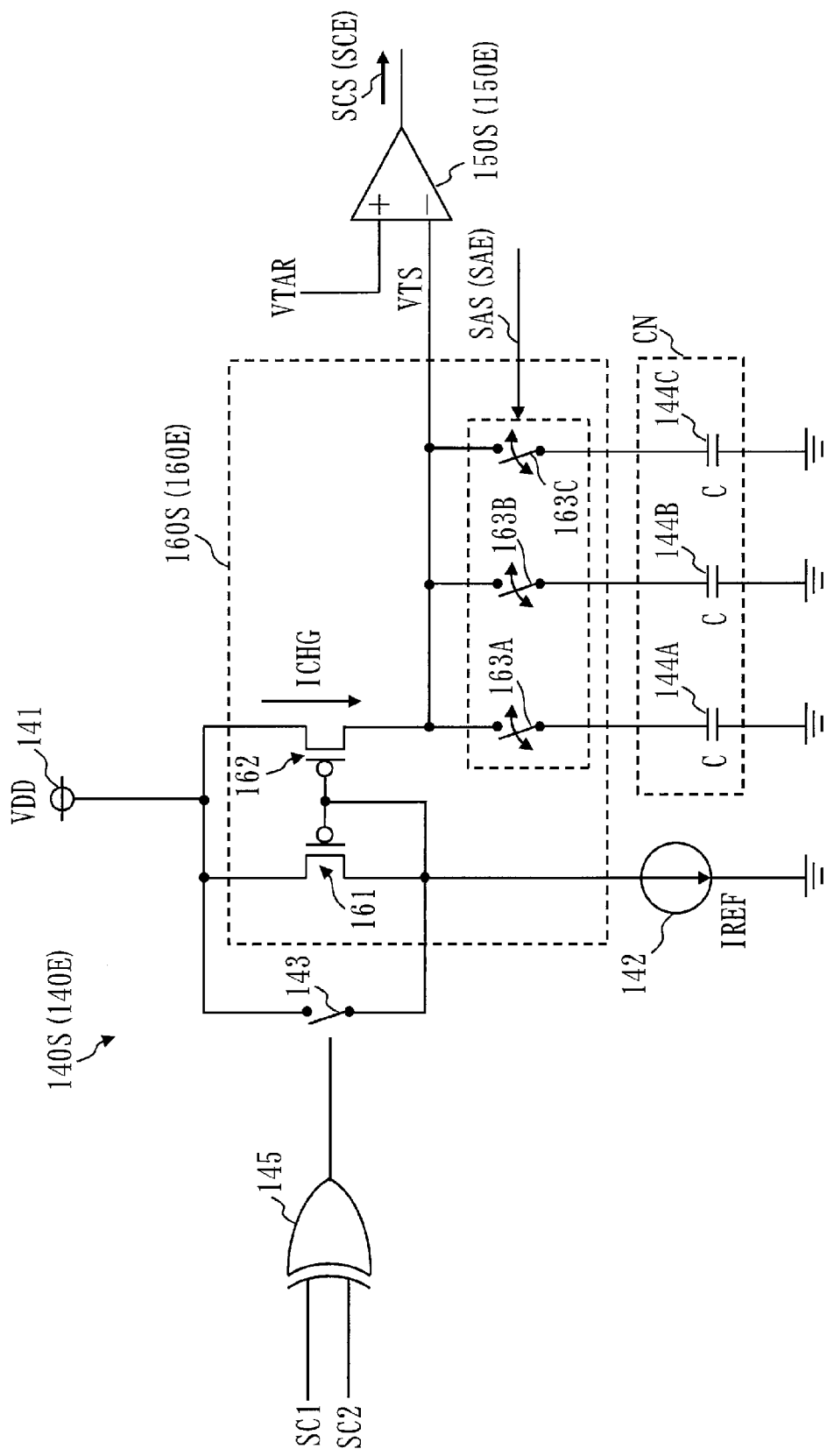
FIG. 8 is a diagram showing a second configuration example of the rising time detecting circuit 140S, the rising time comparing circuit 150S, and the rising regulating circuit 160S according to the first embodiment.

FIG. 8 is a diagram showing a second configuration example of the rising time detecting circuit 140S, the rising time comparing circuit 150S, and the rising regulating circuit 160S according to the first embodiment.

The second configuration example of the rising time detecting circuit 140S, the rising time comparing circuit 150S, and the rising regulating circuit 160S according to the first embodiment will be explained with reference to FIG. 8.

The configuration of the rising time detecting circuit 140S is the same as FIG. 6.

However, the current generated by the current source 142 is the reference current IREF. Further, the rising time detecting circuit 140S is provided with a plurality of capacitors (144A to 144C) which are connected in parallel with each other.

The rising regulating circuit 160S regulates a total capacity CN of the plurality of capacitors (144A to 144C) according to the rising regulating signal SAS received from the control device 210. The total capacity of the plurality of capacitors (144A to 144C) is regulated, and thereby the change speed of the rising time voltage VTS can be regulated.

The rising regulating circuit 160S is provided with a first transistor 161, a second transistor 162 which is connected in parallel to the first transistor 161, a plurality of regulation switches (163A to 163C) which are connected in series to the plurality of capacitors.

Through the first transistor 161, the reference current IREF flows, and through the second transistor 162, the charging current ICHG flows. The magnitude of the charging current ICHG is proportional to the reference current IREF. For instance, the magnitude of the charging current ICHG is the same as the reference current IREF.

The charging current ICHG flows through the capacitor 144 which is connected to the regulation switch 163 with ON status, and thereby charges the capacitor 144.

The rising time voltage VTS is a voltage to charge the capacitor 144 which is connected to the regulation switch 163 with ON status.

The control device 210 selects the size of the total capacity CN out of the plurality of capacities (large, middle, small) based on the length of the target rising time TTRS, and generates the rising regulating signal SAS based on the size of the total capacity CN.

For instance, the control device 210 generates the rising regulating signal SAS like the following. Note that a first threshold time value shows a time being longer than a second threshold time value.

If the target rising time TTRS is longer than the first threshold time value, the control device 210 selects the capacity (small) for the size of the total capacity CN.

In a case where the capacity (small) is selected, the control device 210 generates the rising regulating signal SAS which turns the regulation switch 163A ON and turns the regulation switch 163B and the regulation switch 163C OFF.

If the target rising time TTRS is shorter than the first threshold time value and longer than the second threshold time value, the control device 210 selects the capacity (middle) for the size of the total capacity CN.

In a case where the capacity (middle) is selected, the control device 210 generates the rising regulating signal SAS which turns the regulation switch 163A and the regulation switch 163B ON and turns the regulation switch 163C OFF.

If the target rising time TTRS is shorter than the second threshold time value, the control device 210 selects the capacity (large) for the size of the total capacity CN.

In a case where the capacity (large) is selected, the control device 210 generates the rising regulating signal SAS which turns all the regulation switches (163A to 163C) ON.

That is, in a case where the target rising time TTRS is long, the control device 210 generates the rising regulating signal SAS to control the plurality of regulation switches (163A to 163C) so as to decrease the total capacity CN.

Further, in a case where the target rising time TTRS is short, the control device 210 generates the rising regulating signal SAS to control the plurality of regulation switches (163A to 163C) so as to increase the total capacity CN.

Further, the control device 210 calculates the above expression (3), and thereby calculates the magnitude of the target rising voltage VTRS. Then, the control device 210 generates the target rising voltage VTRS.

FIG. 8 illustrates the configuration of the rising time detecting circuit 140S, the rising time comparing circuit 150S, and the rising regulating circuit 160S; and the configuration of the falling time detecting circuit 140E, the falling time comparing circuit 150E, and the falling regulating circuit 160E are also the same as FIG. 8.

According to the first embodiment, the rising time TS and the falling time TE of the output voltage VOUT can be regulated.

Embodiment 2

Another embodiment will be explained, in which the falling time TE of the output voltage VOUT is regulated.

Hereinafter, items being different from the first embodiment will be mainly explained. The items whose explanation is omitted are the same as the first embodiment.

Figure 9:
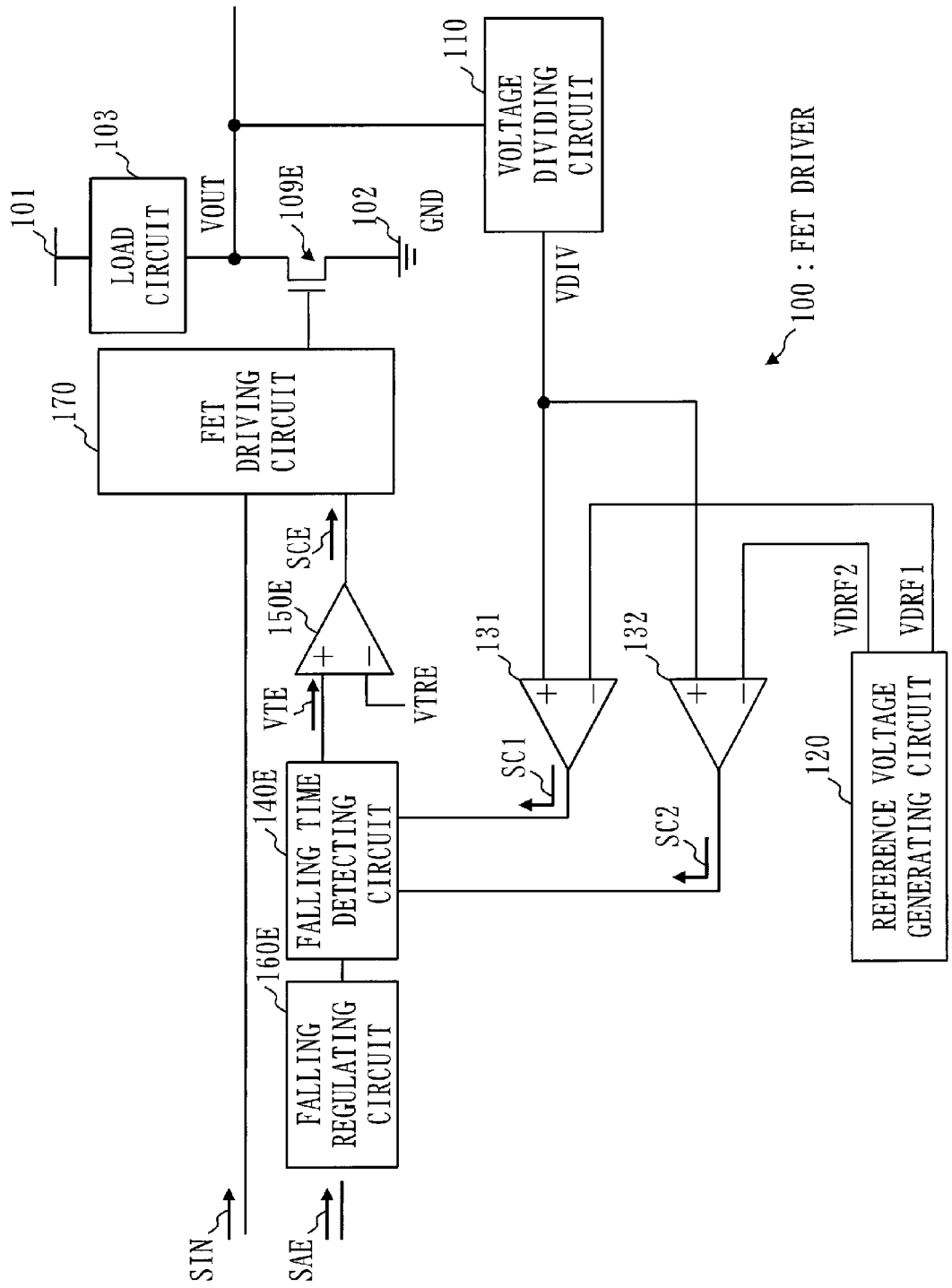
FIG. 9 is a configuration diagram of an FET driver 100 according to a second embodiment.

FIG. 9 is a configuration diagram of a FET driver 100 according to the second embodiment.

The configuration of the FET driver 100 according to the second embodiment will be explained with reference to FIG. 9.

The FET driver 100 is provided with a load circuit 103 instead of the upper MOSFET 109S explained in the first embodiment (refer to FIG. 2). For instance, the load circuit 103 is a resistance element.

The FET driver 100 controls the lower MOSFET 109E, and thereby outputs the output voltage VOUT. The FET driver 100 functions as a low side driver.

The FET driver 100 does not include the rising time detecting circuit 140S, the rising time comparing circuit 150S, and the rising regulating circuit 160S among the configuration explained in the first embodiment (refer to FIG. 2). These configuration parts are for controlling the upper MOSFET 109S and are unnecessary for the second embodiment.

The other parts of the configuration of the FET driver 100 are the same as the first embodiment.

According to the second embodiment, the falling time TE of the output voltage VOUT can be regulated.

Embodiment 3

Another embodiment will be explained, in which the rising time TS of the output voltage VOUT is regulated.

Hereinafter, items being different from the first embodiment will be mainly explained. The items whose explanation is omitted are the same as the first embodiment.

Figure 10:
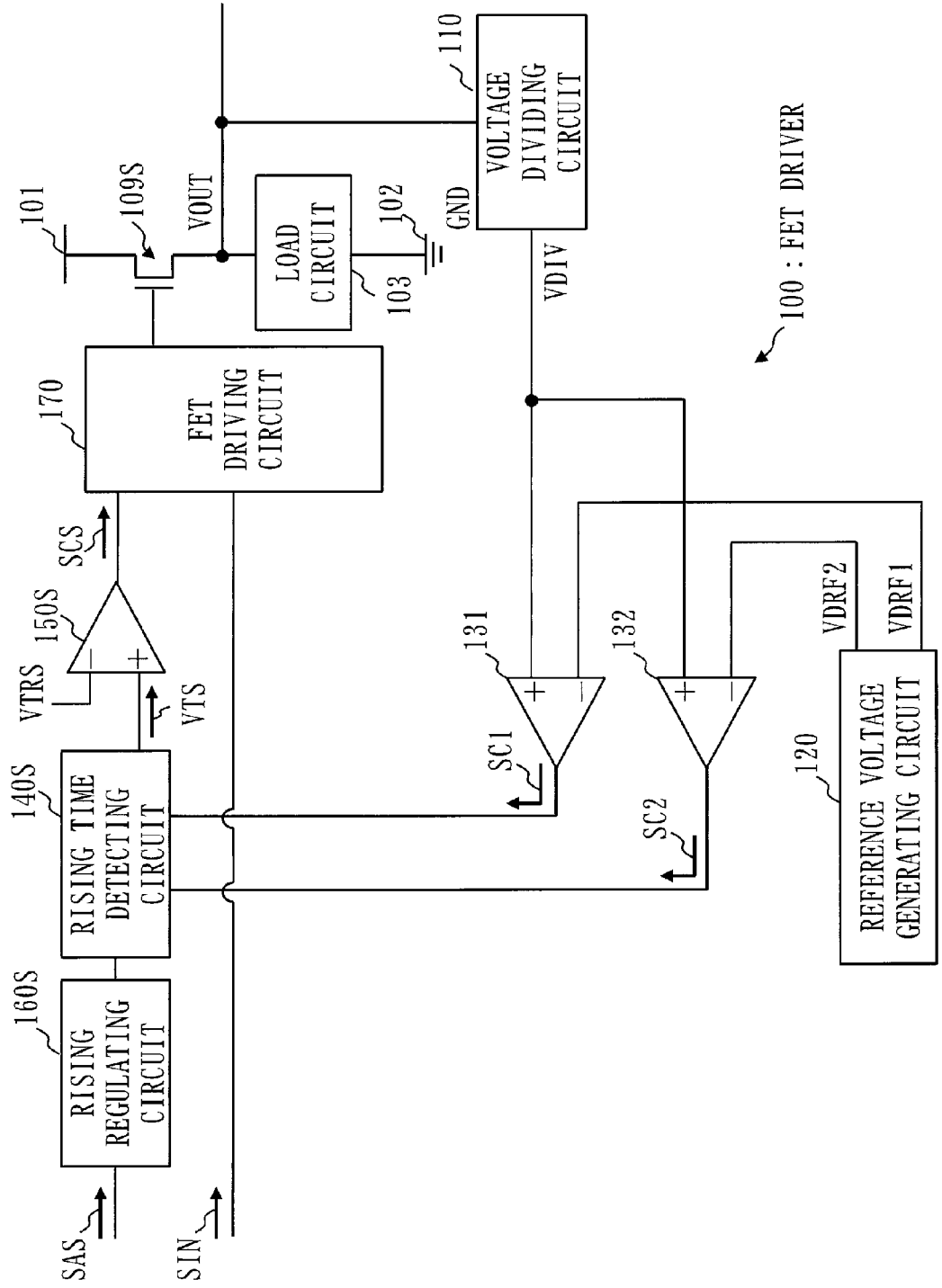
FIG. 10 is a configuration diagram of an FET driver 100 according to a third embodiment.

FIG. 10 is a configuration diagram of a FET driver 100 according to the third embodiment.

The configuration of the FET driver 100 according to the third embodiment will be explained with reference to FIG. 10.

The FET driver 100 is provided with a load circuit 103 instead of the lower MOSFET 109E explained in the first embodiment (refer to FIG. 2). For instance, the load circuit 103 is a resistance element.

The FET driver 100 controls the upper MOSFET 109S, and thereby outputs the output voltage VOUT. The FET driver 100 functions as a high side driver.

The FET driver 100 does not include the falling time detecting circuit 140E, the falling time comparing circuit 150E, and the falling regulating circuit 160E among the configuration explained in the first embodiment (refer to FIG. 2). These configuration parts are for controlling the lower MOSFET 109E and are unnecessary for the third embodiment.

The other parts of the configuration of the FET driver 100 are the same as the first embodiment.

According to the third embodiment, the rising time TS of the output voltage VOUT can be regulated.

Embodiment 4

Another embodiment will be explained, in which the rising time TS and the falling time TE of the output voltage VOUT are regulated.

Hereinafter, items being different from the first embodiment will be mainly explained. The items whose explanation is omitted are the same as the first embodiment.

Figure 11:
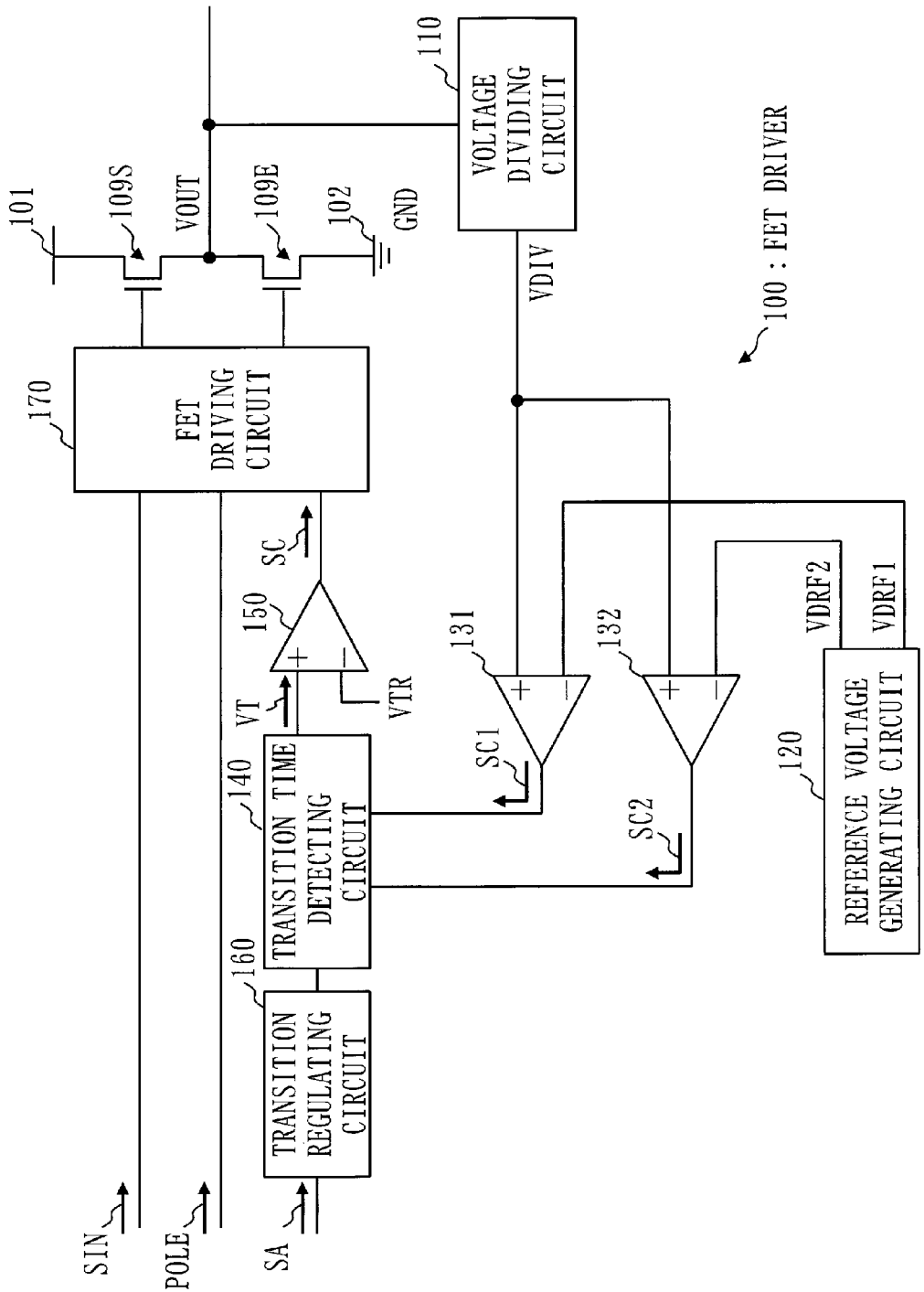
FIG. 11 is a configuration diagram of an FET driver 100 according to a fourth embodiment.

FIG. 11 is a configuration diagram of a FET driver 100 according to the fourth embodiment.

The configuration of the FET driver 100 according to the fourth embodiment will be explained with reference to FIG. 11.

The FET driver 100 is provided with a transition time detecting circuit 140 instead of the rising time detecting circuit 140S and the falling time detecting circuit 140E explained in the first embodiment (refer to FIG. 2).

The transition time detecting circuit 140 outputs, at the time of rising of the output voltage VOUT, a transition time voltage VT corresponding to the rising time voltage VTS (refer to the first embodiment), and outputs, at the time of falling of the output voltage VOUT, a transition time voltage VT corresponding to the falling time voltage VTE (refer to the first embodiment).

The configuration of the transition time detecting circuit 140 is the same as the rising time detecting circuit 140S and the falling time detecting circuit 140E (refer to FIGS. 6 to 8).

The FET driver 100 is provided with a transition time comparing circuit 150 instead of the rising time comparing circuit 150S and the falling time comparing circuit 150E explained in the first embodiment (refer to FIG. 2).

The transition time comparing circuit 150 compares the transition time voltage VT with the target transition voltage VTR received from the control device 210 (refer to FIG. 1), and outputs a transition comparison signal SC showing the compared result. The transition comparison signal SC corresponds to the rising comparison signal SCS and the falling comparison signal SCE (refer to the first embodiment).

The configuration of the transition time comparing circuit 150 is the same as the rising time comparing circuit 150S and the falling time comparing circuit 150E (refer to FIG. 7 or 8).

The FET driver 100 is provided with a transition regulating circuit 160 instead of the rising regulating circuit 160S and the falling regulating circuit 160E explained in the first embodiment (refer to FIG. 2).

The transition regulating circuit 160 regulates the change speed of the transition time voltage VT based on the transition regulation signal SA received from the control device 210 (refer to FIG. 1).

The configuration of the transition regulating circuit 160 is the same as the rising regulating circuit 160S and the falling regulating circuit 160E (refer to FIG. 7 or 8).

The control device 210 (refer to FIG. 1) inputs, at the time of rising of the output voltage VOUT, a transition regulation signal SA corresponding to the rising regulating signal SAS (refer to the first embodiment) to the transition regulating circuit 160. Further, the control device 210 inputs a target transition voltage VTR corresponding to the target rising voltage VTRS (refer to the first embodiment) to the transition time comparing circuit 150.

The control device 210 inputs, at the time of falling of the output voltage VOUT, a transition regulation signal SA corresponding to the falling regulating signal SAE (refer to the first embodiment) to the transition regulating circuit 160. Further, the control device 210 inputs a target transition voltage VTR corresponding to the target falling voltage VTRE (refer to the first embodiment) to the transition time comparing circuit 150.

The control device 210 inputs a control signal SIN and a polar signal POLE to the FET driving circuit 170. The polar signal POLE is a signal synchronized with the control signal SIN.

The FET driving circuit 170 selects one of the upper MOSFET 109S and the lower MOSFET 109E based on the polar signal POLE received from the control device 210. Then, the FET driving circuit 170 controls the change speed of the gate voltage of the selected MOSFET.

If the control signal SIN indicates the start of outputting the output voltage VOUT, the polar signal POLE specifies the upper MOSFET 109S. In this case, the FET driving circuit 170 regulates the rising speed of the gate voltage of the upper MOSFET 109S based on the transition comparison signal SC.

If the control signal SIN indicates the stop of outputting the output voltage VOUT, the polar signal POLE specifies the lower MOSFET 109E. In this case, the FET driving circuit 170 regulates the falling speed of the gate voltage of the lower MOSFET 109E based on the transition comparison signal SC.

The other parts of the configuration of the FET driver 100 are the same as the first embodiment.

According to the fourth embodiment, the rising time TS and the falling time TE of the output voltage VOUT can be regulated.

Further, various circuits (140, 150, 160) are shared at the time of rising of the output voltage VOUT and the time of falling of the output voltage VOUT, and thereby the number of circuits required for the FET driver 100 can be reduced to decrease the size of the FET driver 100.

In each embodiment, MOSFET is an example of a voltage control element (also called as a power element) which controls electric power and voltage, and another voltage control element can be also used instead of MOSFET.

For instance, MOSFET can be altered by IGBT or SiC element. IGBT is an abbreviation for an insulated gate bipolar transistor; and SiC is an abbreviation for Silicon Carbide.

Each embodiment is an example of the electronic device 200 (in particular, the FET driver 100).

That is, the electronic device 200 can exclude a part of the configuration elements explained in each of the embodiments. Further, the electronic device 200 can include a configuration element which is not explained in each of the embodiments.

Numerous additional modifications and variations are possible in light of the above teachings. It is therefore to be understood that, within the scope of the appended claims, the disclosure of this patent specification may be practiced otherwise than as specifically described herein.

REFERENCE SIGNS LIST

100: FET driver; 101: voltage source; 102: ground; 103: load circuit; 109S: upper MOSFET; 109E: lower MOSFET; 110: voltage dividing circuit; 111: first voltage dividing resistance; 112: second voltage dividing resistance; 120: reference voltage generating circuit; 131: first comparing circuit; 132: second comparing circuit; 140: transition time detecting circuit; 140S: rising time detecting circuit; 140E: falling time detecting circuit; 141: voltage source; 142: current source; 143: charging switch; 144: capacitor; 145: XOR circuit; 150: transition time comparing circuit; 150S: rising time comparing circuit; 150E: falling time comparing circuit; 160: transition regulating circuit; 160S: rising regulating circuit; 160E: falling regulating circuit; 161: first transistor; 162: second transistor; 163: regulation switch; 170: FET driving circuit; 200: electronic device; 210: control device; and 220: load device.

The invention claimed is:

1. A voltage controller comprising:
a voltage control element that controls a speed to change an output voltage;
a rising time detecting circuit that detects a rising time of the output voltage controlled by the voltage control element required for rising from a first reference voltage to a second reference voltage, and generates a rising time voltage according to a length of the rising time;
a rising time comparing circuit that compares the rising time voltage generated by the rising time detecting circuit with a target rising voltage showing a target rising time which is a target of the rising time, and outputs a rising comparison signal showing a compared result; and
an element control circuit that controls the voltage control element based on the rising comparison signal output by the rising time comparing circuit.

2. The voltage controller of claim 1, further comprising a rising regulating circuit that regulates a change speed of the rising time voltage,
wherein the rising time detecting circuit generates a voltage which is changed in the rising time with the change speed regulated by the rising regulating circuit as the rising time voltage.

3. The voltage controller of claim 2,
wherein the rising time detecting circuit comprises a capacitor that generates the rising time voltage by being charged, and
wherein the rising regulating circuit regulates a magnitude of a charging current to charge the capacitor which is provided at the rising time detecting circuit, thereby regulating the change speed of the rising time voltage.

4. The voltage controller of claim 2,
wherein the rising time detecting circuit comprises a plurality of capacitors that generate the rising time voltage by being charged, and
wherein the rising regulating circuit selects a capacitor from the plurality of capacitors provided at the rising time detecting circuit and flows a charging current to the selected capacitor, thereby regulating the change speed of the rising time voltage.

5. The voltage controller of claim 1,
wherein the voltage control element is a first voltage control element that controls a speed to increase the output voltage,
the voltage controller further comprising:
a second voltage control element that controls a speed to decrease the output voltage;
a falling time detecting circuit that detects a falling time of the output voltage controlled by the voltage control element required for falling from the second reference voltage to the first reference voltage, and generates a falling time voltage according to a length of the falling time; and
a falling time comparing circuit that compares the falling time voltage generated by the falling time detecting circuit with a target falling voltage showing a target falling time which is a target of the falling time, and outputs a falling comparison signal showing a compared result,
wherein the element control circuit, in a case where a control signal received from an outside indicates a rising of the output voltage, controls the first voltage control element based on the rising comparison signal, and in a case where the control signal indicates a falling of the output voltage, controls the second voltage control element based on the falling comparison signal.

6. A voltage controller comprising:
a voltage control element that controls a speed to change an output voltage;
a falling time detecting circuit that detects a falling time of the output voltage controlled by the voltage control element required for falling from a second reference voltage to a first reference voltage, and generates a falling time voltage according to a length of the falling time;
a falling time comparing circuit that compares the falling time voltage generated by the falling time detecting circuit with a target falling voltage showing a target falling time which is a target of the falling time, and outputs a falling comparison signal showing a compared result; and an element control circuit that controls the voltage control element based on the falling comparison signal output by the falling time comparing circuit.

7. A voltage controller comprising:
a first voltage control element that controls a speed to increase an output voltage;
a second voltage control element that controls a speed to decrease the output voltage;
a transition time detecting circuit that detects one of a rising time of the output voltage controlled by the first voltage control element required for rising from a first reference voltage to a second reference voltage and a falling time of the output voltage controlled by the second voltage control element required for falling from the second reference voltage to the first reference voltage, as a transition time, and generates a transition time voltage according to a length of the transition time;
a transition time comparing circuit that compares the transition time voltage generated by the transition time detecting circuit with a target transition voltage showing a target transition time that is a target of the transition time, and outputs a transition comparison signal showing a compared result; and
an element control circuit that, in a case where a control signal received from an outside indicates a rising of the output voltage, controls the first voltage control element based on the transition comparison signal, and in a case where the control signal indicates a falling of the output voltage, controls the second voltage control element based on the transition comparison signal.

* * * * *